United States Patent
Sasaki (10) Patent No.: US 9,484,232 B2
(45) Date of Patent: Nov. 1, 2016

(54) ZONE TEMPERATURE CONTROL STRUCTURE

(75) Inventor: Yasuharu Sasaki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1259 days.

(21) Appl. No.: 13/070,929

(22) Filed: Mar. 24, 2011

(65) Prior Publication Data

US 2011/0232888 A1    Sep. 29, 2011

Related U.S. Application Data

(60) Provisional application No. 61/325,626, filed on Apr. 19, 2010.

(30) Foreign Application Priority Data

Mar. 25, 2010   (JP) ................................. 2010-069083

(51) Int. Cl.

| | | |
|---|---|---|
| C23C 16/00 | (2006.01) | |
| C23F 1/00 | (2006.01) | |
| H01L 21/306 | (2006.01) | |
| H01L 21/67 | (2006.01) | |
| H01J 37/32 | (2006.01) | |

(52) U.S. Cl.
CPC ... *H01L 21/67103* (2013.01); *H01J 37/32091* (2013.01); *H01J 37/32165* (2013.01); *H01J 37/32724* (2013.01)

(58) Field of Classification Search
USPC ............................ 118/724, 725; 156/345.27, 156/345.51–345.55
See application file for complete search history.

(56) References Cited

U.S. PATENT DOCUMENTS

| | | | | |
|---|---|---|---|---|
| 4,873,942 A | * | 10/1989 | Engle ............................ | 118/728 |
| 2006/0076109 A1 | * | 4/2006 | Holland et al. ........... | 156/345.27 |
| 2006/0207725 A1 | * | 9/2006 | Oohashi et al. ......... | 156/345.53 |
| 2008/0092818 A1 | * | 4/2008 | Fink et al. .................... | 118/724 |
| 2009/0173334 A1 | * | 7/2009 | Krs et al. ....................... | 126/569 |
| 2010/0304571 A1 | * | 12/2010 | Larson et al. ................ | 438/710 |

FOREIGN PATENT DOCUMENTS

| | | | | |
|---|---|---|---|---|
| JP | 9-255474 | A | 9/1997 | |
| JP | 2000-294868 | A | 10/2000 | |
| JP | 2004-292297 | | 10/2004 | |
| JP | 2005-5434 | A | 1/2005 | |
| JP | WO2009078923 | | * 6/2009 | ........... H01L 21/205 |

OTHER PUBLICATIONS

English Machine Translation JP 2004292297, Masami dated Oct. 21, 2004.*

* cited by examiner

*Primary Examiner* — Rakesh Dhingra
(74) *Attorney, Agent, or Firm* — Oblon, McClelland, Maier & Neustadt, L.L.P.

(57) ABSTRACT

A zone temperature control structure which has two or more zone of which surface temperatures are controlled to different temperatures, respectively. The structure can maintain a temperature difference by suppressing heat conduction in a direction in which the zones are arrayed, and prevent formation of a hot spot by ensuring smooth heat conduction for heat input in a direction intersecting the direction in which the zones are arrayed. A heat-conducting anisotropic material layer is disposed between the two or more zones. The heat-conducting anisotropic material layer is configured such that heat conductivity is lower in the direction in which the two or more zones are arrayed than in the direction intersecting the direction in which the two or more zones are arrayed.

12 Claims, 6 Drawing Sheets

ZONE TEMPERATURE CONTROL STRUCTURE

BACKGROUND OF THE INVENTION

1. Field of the Invention

The present invention relates to a zone temperature control structure having zone of which surface temperatures are controlled to different temperature, respectively.

2. Description of the Related Art

As a mounting stage (susceptor) on which a wafer is mounted in a substrate processing apparatus that subjects a semiconductor wafer (hereafter referred to merely as "the wafer") as a substrate to plasma processing, there is known a susceptor that controls a mounting surface divided into a plurality of temperature zones and supports a wafer in the temperature zones.

A zone temperature control structure of which surface is controlled to a plurality of temperature zones, or an assembly structure having a plurality of temperature zone assembly members adjusted to different temperatures from one another like the susceptor supporting a wafer in the temperature zones has a problem that when the respective zones are adjusted in temperature, heat transfer occurs on a boundary surface or a connecting surface between different temperature zones adjacent to each other, resulting in decreasing heat efficiency. There is also another problem that a temperature difference between the zones cannot be ensured.

Accordingly, there has been developed a technique that in such a zone temperature control structure or an assembly structure, a heat insulator is disposed between adjacent zones, or adjacent zones are made of materials with different heat conductivities so as to prevent decrease in heat efficiency and ensure a temperature difference between the zones at the time of temperature adjustment (see Japanese Laid-Open Patent Publication No. (Kokai) 2004-292297, for example).

However, when a heat insulator is disposed between the zones controlled to different temperatures in the zone temperature control structure, this raises the problem that in response to heat input in a direction intersecting a direction in which the zones are arrayed, the temperature immediately above the insulator becomes higher than ambient temperature to form a singular point in terms of temperature (hereafter referred to as "the hot spot"). The hot spot does not only hinder temperature uniformity in the zone adjusted/controlled to a predetermined temperature, but also causes heat efficiency to decrease.

SUMMARY OF THE INVENTION

It is an object of the present invention to provide a zone temperature control structure, having two or more zones controlled to different temperatures, can maintain a temperature difference by suppressing heat conduction in a direction in which the zones are arrayed, and prevent formation of a hot spot by ensuring smooth heat conduction for heat input in a direction intersecting the direction in which the zones are arrayed.

Accordingly, an aspect of the present invention can provide a zone temperature control structure, comprising: at least two zones configured to have surface temperatures thereof controlled to different temperatures, respectively; and a heat-conducting anisotropic material layer disposed between the at least two zones, the heat-conducting anisotropic material layer is configured such that heat conductivity is lower in a direction in which the at least two zones are arrayed than in a direction intersecting the direction in which the at least two zones are arrayed.

According to the present invention, the zone temperature control structure has the two or more zones of which surface temperatures are controlled to different temperatures, respectively, and the heat-conducting anisotropic material layer disposed between the two or more zones, and the heat-conducting anisotropic material layer is configured such that heat conductivity is lower in the direction in which the two or more zones are arrayed than in the direction intersecting the direction in which the two or more zones are arrayed. As a result, a temperature difference can be maintained by suppressing heat conduction in a direction in which the zones are arrayed, and formation of a hot spot can be prevented by ensuring smooth heat conduction for heat input in a direction intersecting the direction in which the zones are arrayed.

The aspect of the present invention can provide a structure, wherein in relative relationships with heat conduction in the direction in which the at least two zones are arrayed and heat conduction in the direction intersecting the direction in which the at least two zones are arrayed, the heat-conducting anisotropic material layer acts as a heat insulation layer for heat conduction in the direction in which the at least two zones are arrayed, and acts as a heat conducting layer for heat conduction in the direction intersecting the direction in which the at least two zones are arrayed.

The aspect of the present invention can provide a structure, wherein the ratio of the heat conductivity in the direction intersecting the direction in which the at least two zones are arrayed to the heat conductivity in the direction in which the at least two zones are arrayed is 7 or more.

The aspect of the present invention can provide a structure, wherein the heat-conducting anisotropic material layer is made of a composite material selected from a group of a set of titanium and carbon, a set of aluminum and carbon fiber, a set of titanium and aluminum, and a set of glasslike carbon and carbon.

The aspect of the present invention can provide a structure as claimed in claim 1, wherein the at least two zones are made of heat-conducting isotropic materials.

The aspect of the present invention can provide a structure, wherein the zone temperature control structure is a plate-like unit in which the at least two zones are arrayed in a predetermined direction, and the heat-conducting anisotropic material layer passes the plate-like unit in a thickness direction thereof.

The aspect of the present invention can provide a structure as claimed in claim 1, wherein the at least two zones each comprises temperature adjusting means, and the heat-conducting anisotropic material layer is disposed between adjacent temperature adjusting means.

The aspect of the present invention can provide a structure as claimed in claim 7, wherein the temperature adjusting means is a medium flow path through which a heat exchange medium is circulated, a Peltier device, or a resistance heater.

The aspect of the present invention can provide a structure, wherein the zone temperature control structure is one of a mounting stage, an upper electrode plate, and a deposit shield in a substrate processing apparatus.

Further features of the present invention will become apparent from the following description of exemplary embodiments with reference to the attached drawings.

DETAILED DESCRIPTION OF PREFERRED EMBODIMENTS

The present invention will now be described in detail with reference to the drawings showing embodiments thereof.

Figure 1:
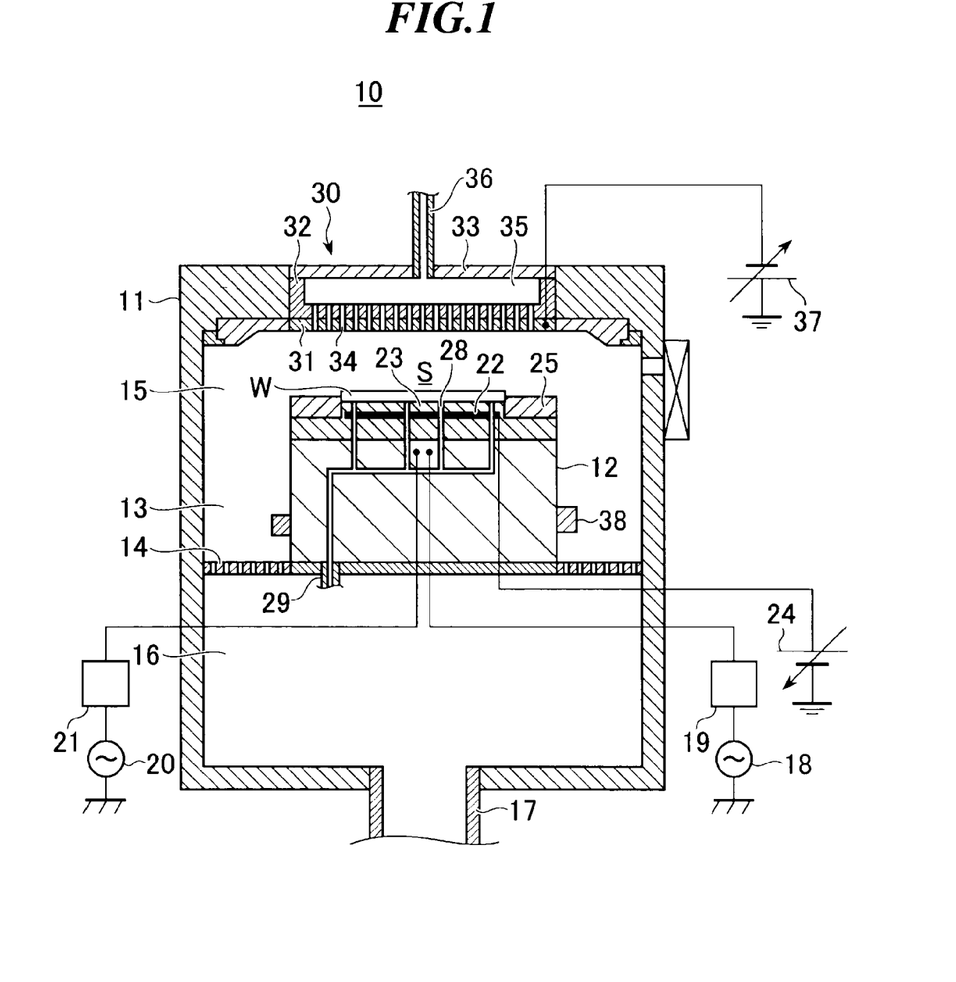
FIG. 1 is a cross-sectional view schematically showing the construction of a substrate processing apparatus to which a zone temperature control structure according to an embodiment of the present invention is applied as a constituent member.

FIG. 1 is a cross-sectional view schematically showing the construction of a substrate processing apparatus to which a zone temperature control structure according to an embodiment of the present invention is applied as a constituent member.

Referring to FIG. 1, the substrate processing apparatus carries out predetermined plasma etching processing on wafers.

The substrate processing apparatus 10 has a chamber 11 in which a wafer W is accommodated, and a disk-shaped susceptor 12 on which a wafer W is mounted is disposed in the chamber 11. A side exhaust path 13 is formed between an inside wall of the chamber 11 and a side face of the susceptor 12. An exhaust plate 14 is disposed part way along the side exhaust path 13.

The exhaust plate 14, which is a plate-like member having a number of through holes, acts as a partition plate that partitions the interior of the chamber 1 into an upper portion and a lower portion. As will be described later, plasma is produced in the upper portion (hereafter referred to as "the processing chamber") 15 of the chamber 11 partitioned by the exhaust plate 14. An exhaust pipe 17 that exhausts gas out from the chamber 11 is connected to the lower portion (hereafter referred to as "the exhaust chamber (manifold)") 16 of the chamber 11. The exhaust plate 14 captures or reflects plasma produced in the processing chamber 15, thus preventing leakage of the plasma into the manifold 16.

The exhaust pipe 17 has a TMP (turbo-molecular pump) (not shown) and a DP (dry pump) (not shown) connected thereto, and these pumps vacuum the interior of the chamber 11 to reduce the pressure in the chamber 11 down to a predetermined pressure. It should be noted that an APC valve (not shown) controls the pressure in the chamber 11.

A first radio frequency power source 18 is connected to the susceptor 12 in the chamber 11 via a first matcher 19, and a second radio frequency power source 20 is connected to the susceptor 12 in the chamber 11 via a second matcher 21. The first radio frequency power source 18 applies biasing radio frequency electrical power of a relatively low frequency, for example, 2 MHz to the susceptor 12, and the second radio frequency power source 20 applies plasma-producing radio frequency electrical power of a relatively high frequency, for example, 60 MHz to the susceptor 12. The susceptor 12 thus acts as an electrode. The first matcher 19 and the second matcher 21 reduce reflection of the radio frequency electrical power from the susceptor 12 so as to maximize the efficiency of the supply of the radio frequency electrical power into the susceptor 12.

An electrostatic chuck 23 having an electrostatic electrode plate 22 therein is disposed on an upper portion of the susceptor 12. The electrostatic chuck 23 has a step, and is made of ceramics or the like.

A DC power source 24 is connected to the electrostatic electrode plate 22. Upon a positive DC voltage being applied to the electrostatic electrode plate 22, a negative potential is produced on a surface of the wafer W on a side of the electrostatic chuck 23 (hereafter referred to as "the rear surface"). A potential difference thus arises between the electrostatic electrode plate 22 and the rear surface of the wafer W, and hence the wafer W is attracted to and held on the electrostatic chuck 23 through an electrostatic force, for example, a Coulomb force or a Johnsen-Rahbek force due to the potential difference.

A focus ring 25 is mounted on a horizontal part of the step in the electrostatic chuck 23 so as to surround the wafer W attracted to and held on the electrostatic chuck 23. The focus ring 25 is made of, for example, silicon (Si) or silicon carbide (SiC).

An annular medium flow path, to be described later, which extends, for example, in a circumferential direction of the susceptor 12 is provided inside the susceptor 12. A heat exchange medium, for example, cooling water or a Galden (registered trademark) fluid at a predetermined temperature is circulated through the medium flow path via medium piping from a chiller unit (not shown). The susceptor 12 cooled by the heat exchange medium cools the wafer W and the focus ring 25 via the electrostatic chuck 23. It should be noted that the medium flow path should not always be used for cooling, but may be used for maintaining room temperature or heating. Thus, the heat exchange medium flowing through the medium flow path has only to be one which is generally used as a heat exchange medium, and the medium flow path is used as a heat exchange medium flow path.

A plurality of heat-transmitting gas supply holes 28 are opened to a portion of the electrostatic chuck 23 on which the wafer W is attracted and held (hereinafter referred to as "the attracting surface"). The heat-transmitting gas supply holes 28 are connected to a heat-transmitting gas supply unit (not shown) by a heat-transmitting gas supply line 29. The heat-transmitting gas supply unit supplies He (helium) gas as a heat-transmitting gas via the heat-transmitting gas supply holes 28 into a gap between the attracting surface and a rear surface of the wafer W. The He gas supplied into the gap between the attracting surface and the rear surface of the wafer W effectively transmits heat of the wafer W to the electrostatic chuck 23.

A shower head 30 is disposed in a ceiling portion of the chamber 11 so as to face the susceptor 12 via a processing space S of the processing chamber 15. The shower head 30 has an upper electrode plate 31, a cooling plate 32 that removably suspends the upper electrode plate 31, and a lid 33 that covers the cooling plate 32. The upper electrode plate 31 is comprised of a disk-shaped member having a number of gas holes 34 passing therethrough in a thickness direction, and made of Si or SiC, which is a semi-conductive material. A buffer chamber 35 is provided inside the cooling plate 32, and a processing gas introducing pipe 36 is connected to the buffer chamber 35.

The upper electrode plate 31 of the shower head 30 is grounded.

In the substrate processing apparatus 10 constructed as described above, a processing gas supplied from the processing gas introducing pipe 36 to the buffer chamber 37 is introduced into the processing chamber 15, and then is excited and turned into plasma by the plasma-producing radio frequency electrical power applied into the processing chamber 15 from the second radio frequency electrical power source 20 via the susceptor 12. Ions in the plasma are attracted toward the wafer W by the biasing radio frequency electrical power applied to the susceptor 12 by the second radio frequency electrical power source 18, whereby the wafer W is subjected to the plasma etching processing by the ions.

Operation of the component elements of the substrate processing apparatus 10 described above is controlled in accordance with a program for the plasma etching processing by a CPU of a control unit (not shown) of the substrate processing apparatus 10.

For the substrate processing apparatus described above, it can be considered that to make the density of radicals uniform in the processing space S, the surface of the susceptor 12 is divided into a center area and an edge area surrounding the center area, and the temperature of the edge area is adjusted to be lower than that of the center area. In this case, it can be considered that to prevent heat efficiency from decreasing due to heat conduction occurring at an annular boundary between the center area and the edge area of the susceptor 12, a heat insulator is disposed between the center area and the edge area. The heat insulator can prevent heat transfer between the center area and the edge area, but has a problem that a hot spot is formed above the heat insulator because the heat insulator acts as a heat insulator for heat input from above accompanying plasma generation in the processing space S, thereby disabling the density of radicals in the processing space S to be uniform, and eventually disabling heat efficiency to be improved.

As a result of carrying out assiduous studies on heat conduction between adjacent annular temperature zones and in a direction in which the annular temperature zones are arrayed and heat conduction in a direction intersecting the direction in which the annular temperature zones are arrayed in a zone temperature control structure, having zones of which surface temperatures controlled to different temperatures, respectively, controls the annular temperature zones, the present inventors found out that by disposing a heat-conducting anisotropic material layer between the plurality of annular temperature zones, heat conduction between the plurality of annular temperature zones can be suppressed to maintain a temperature difference, and heat conduction in the direction intersecting the direction in which the plurality of annular temperature zones are arrayed is promoted to prevent a hot spot from being formed, and arrived at the present invention.

Specifically, the zone temperature control structure according to the present invention has two or more zones of which surface temperatures are controlled to respective different temperatures, and a heat-conducting anisotropic material layer disposed between the two or more zones, and the heat-conducting anisotropic material layer is configured such that heat conductivity is lower in a direction in which the two or more zones are arrayed than in a direction intersecting the direction in which the two or more zones are arrayed.

Next, a description will be given of a principle of the present invention with reference to the drawings.

Figure 2:
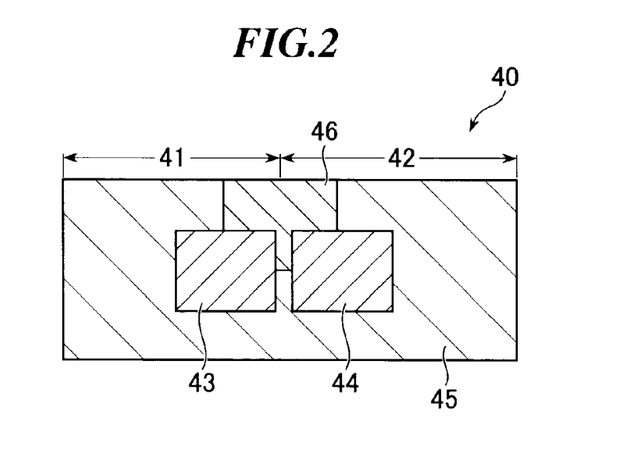
FIG. 2 is a cross-sectional view schematically showing the construction of an exemplary zone temperature control structure.

FIG. 2 is a cross-sectional view schematically showing the construction of an exemplary zone temperature control structure.

Referring to FIG. 2, the zone temperature control structure 40 constituting a part of the susceptor 12 is comprised mainly of a structure main body 45 having a first annular temperature zone 41 and a second annular temperature zone 42 which are disposed adjacent to each other in a horizontal radial direction as viewed in FIG. 2, a first annular medium flow path 43 as a first temperature adjusting means disposed in the first annular temperature zone 41, a second annular medium flow path 44 as a second temperature adjusting means disposed in the second annular temperature zone 42, and an annular boundary member 46 (heat-conducting anisotropic material layer) disposed between the first annular temperature zone 41 and the second annular temperature zone 42. The structure main body 45 is comprised of a heat-conducting isotropic material such as carbon. It should be noted that in the following description, a direction in which the annular temperature zones of which surface temperatures are adjusted to different temperatures are arrayed will be referred to as the horizontal radial direction, and a direction intersecting the direction in which the annular temperature zones are arrayed will be referred to as the vertical direction for the sake of convenience.

The annular boundary member 46 is T-shaped in cross section perpendicular to directions in which heat transfer media flow through the first annular medium flow path 43 and the second annular medium flow path 44 (shown as segments by FIGS. 3A to 3D to be described later), and a vertical portion of the T-shaped cross section (hereafter referred to as "the partition portion") is disposed between the first annular temperature zone 41 and the second annular temperature zone 42, and both ends of a horizontal portion of the T-shaped cross section are disposed so as to lie on upper portions of the first annular medium flow path 43 and the second annular medium flow path 44.

Model cases where four annular boundary members 46a to 46d shown as segments by FIGS. 3A to 3D are applied as the annular boundary member 46 in the zone temperature control structure 40 constructed as described above are simulated.

FIGS. 3A to 3D are perspective views useful in explaining respective segments of annular boundary members disposed between the first annular temperature zone 41 and the second annular temperature zone 42 shown in FIG. 2.

Figure 3A:
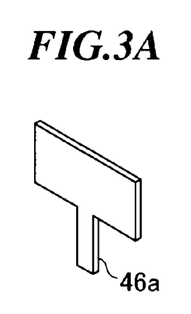
FIGS. 3A to 3D are perspective views useful in explaining respective segments of annular boundary members disposed between a first annular temperature zone and a second annular temperature zone appearing in FIG. 2.

The annular boundary member 46a in FIG. 3A has, for example, a horizontal portion of the T-shaped cross section with a length of 10 mm and a width of 5 mm, and a partition portion of the T-shaped cross section with a total length of 10 mm and a width of 1.7 mm. The annular boundary member 46a has the whole T-shaped cross section thereof made of a heat-conducting isotropic material having isotropic heat conductivity, for example, carbon.

Figure 3B:
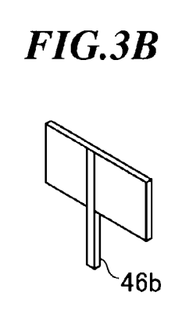

The annular boundary member 46b in FIG. 3B has, for example, a horizontal portion of the T-shaped cross section with a length of 10 mm and a width of 5 mm, and a partition portion of the T-shaped cross section with a total length of 10 mm and a width of 0.5 mm. The annular boundary member 46b has the whole partition portion thereof made of a heat insulator, for example, titanium, while the horizontal portion is made of carbon.

Figure 3C:
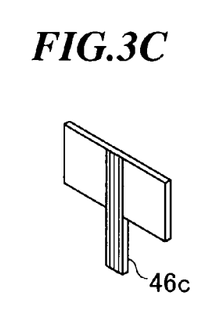

The annular boundary member 46c in FIG. 3C has the same dimensions of the T-shaped cross section as those of the annular boundary member 46a in FIG. 3A, and has the whole partition portion thereof made of a heat insulator, for example, titanium, while the horizontal portion is made of carbon. The annular boundary member 46c differs from the annular boundary member 46a in FIG. 3A in that, for example, five layers of heat insulators with a width of, for example, 0.1 mm are provided at predetermined intervals, for example, at intervals of 0.3 mm in a width direction (horizontal radial direction) of the partition portion. As the heat insulators, titanium applied to the partition portion in FIG. 3B is used. The partition portion of the annular boundary member 46c has properties as a heat-conducting anisotropic material (hereafter referred to as a "gradient member"). The annular boundary member 46c acts as, for example, a heat insulator for heat conduction in the horizontal radial direction, and acts as, for example, a heat conductor for heat conduction in the vertical direction.

Figure 3D:
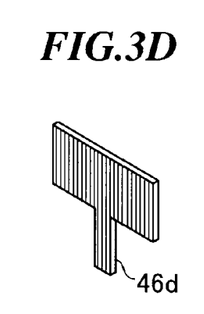

The annular boundary member 46d in FIG. 3D has the same dimensions of the T-shaped cross section as those of the annular boundary member 46a in FIG. 3A, and has the whole T-shaped cross section thereof made of carbon. The annular boundary member 46c differs from the annular boundary member 46a in FIG. 3A in that a number of heat insulator layers with a predetermined width, for example, a width of 0.1 mm are provided at predetermined intervals, for example, at intervals of 0.3 mm in the horizontal radial direction over the entire horizontal portion and partition portion. The whole T-shaped cross section of the annular boundary member 46d functions as a gradient member. The annular boundary member 46d thus acts as, for example, a heat insulator for heat conduction in the horizontal radial direction, and acts as, for example, a heat conductor compound for heat conductor in the vertical direction.

Model cases where the four annular boundary members 46a to 46d in FIGS. 3A to 3D are applied as the annular boundary member 46 in the zone temperature control structure 40 constructed described above were simulated, and temperature distributions in the horizontal radial direction as viewed in FIG. 2 on surfaces of the first annular temperature zone 41 and the second annular temperature zone 42 in a case where such a heat exchange medium was circulated that the temperature of the medium flow path 43 in the first annular temperature zone 41 could be 308 (K) (Kelvin), and such a heat exchange medium is circulated that the second annular medium flow path 44 in the second annular temperature zone 42 could be 323 (K) (Kelvin) were obtained. The results are shown in FIG. 4.

Figure 5:
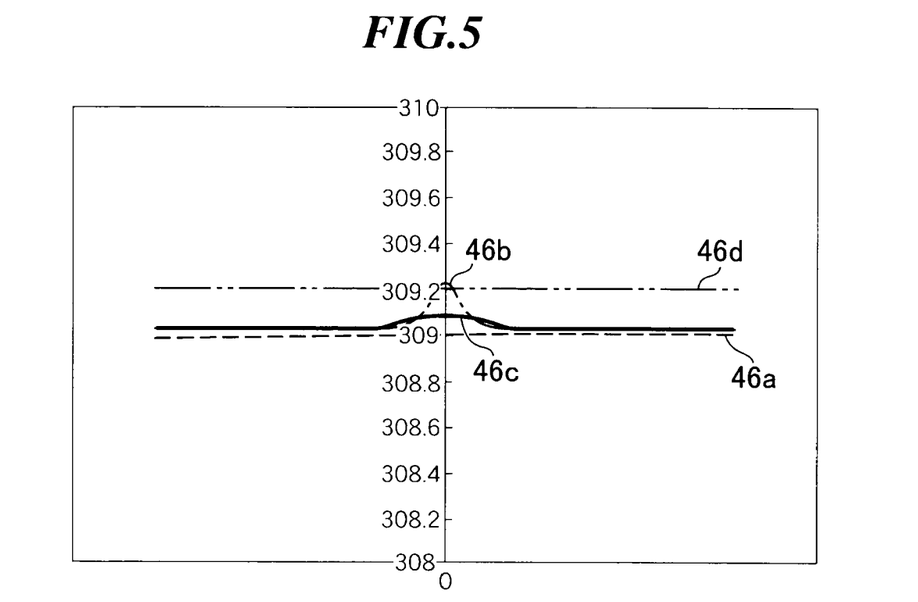
FIG. 5 is a diagram showing characteristics of the annular boundary members shown by FIGS. 3A to 3D for heat conduction in a vertical direction.

Also, in a state in which such exchange media were circulated that the temperatures of both the first annular medium flow path 43 and the second annular medium flow path 44 could be 308 (K) (Kelvin), heat arising from plasma produced by applying electrical power of 2800 (W/m$^2$) from above was irradiated, and temperature distributions in the horizontal radial direction as viewed in FIG. 2 on surfaces of the first annular temperature zone 41 and the second annular temperature zone 42 were obtained. The results are shown in FIG. 5.

Figure 4:
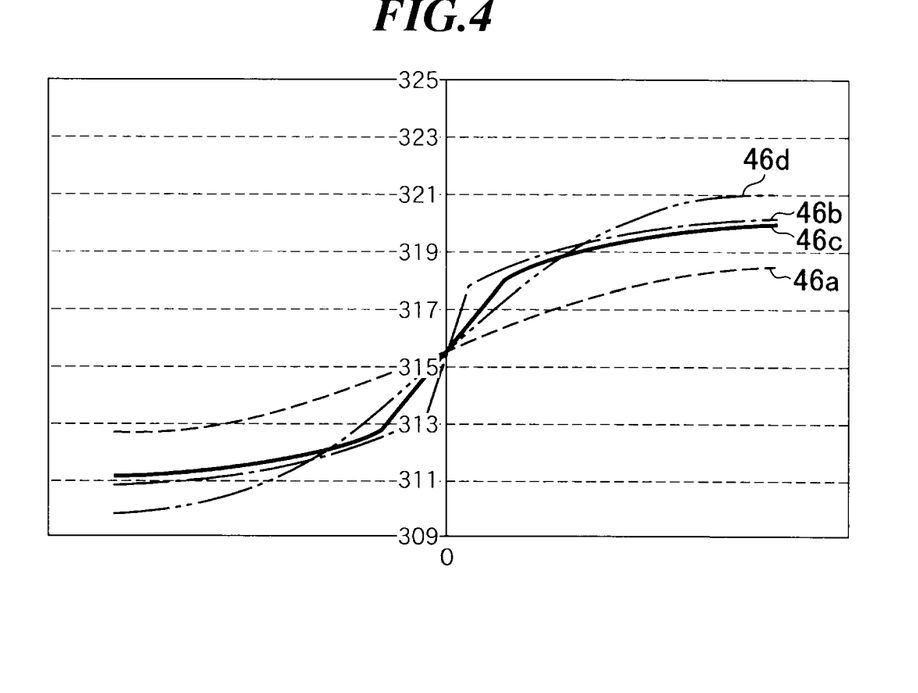
FIG. 4 is a diagram showing characteristics of the annular boundary members shown by FIGS. 3A to 3D for heat conduction in a horizontal radial direction.

FIG. 4 is a diagram showing characteristics of the annular boundary members shown by FIGS. 3A to 3D for heat conduction in the horizontal radial direction.

In FIG. 4, the vertical axis represents temperature (K), and the horizontal axis represents distance from a boundary (0) between the first annular temperature zone 41 and the second annular temperature zone 42.

Referring to FIG. 4, as indicated by a broken line, in the structure using the annular boundary member 46a in FIG. 3A, the surface temperature of the first annular temperature zone 41 increases due to the surface temperature of the second annular temperature zone 42, and on the other hand, the surface temperature of the second annular temperature zone 42 decreases due to the surface temperature of the first annular temperature zone 41, so that there is no clear boundary between the surface temperature of the first annular temperature zone 41 and the surface temperature of the second annular temperature zone 42. It should be noted that because the first annular temperature zone 41 and the second annular temperature zone 42 are made of a heat-conducting isotropic materials as described above, surface temperature and internal temperature in each area are considered equal. Thus, in the following description, surface temperature and internal temperature in each area may be referred to merely as area temperature without being discriminated from each other.

As indicated by a chain line, the structure using the annular boundary member 46b in FIG. 3B has a clear temperature boundary between the first annular temperature zone 41 and the second annular temperature zone 42, which shows that the annular boundary member 46b acts as a heat insulator for heat conduction in the direction in which the first annular temperature zone 41 and the second annular temperature zone 42 are arrayed.

As indicated by a solid line, the structure using the annular boundary member 46c in FIG. 3C has a clear temperature boundary between the first annular temperature zone 41 and the second annular temperature zone 42 as with the structure using the annular boundary member 46b in FIG. 3B, which shows that the annular boundary member 46c acts as a heat insulator for heat conduction in the direction in which the first annular temperature zone 41 and the second annular temperature zone 42 are arrayed.

On the other hand, as indicated by a two-dot chain line, the structure using the annular boundary member 46d in FIG. 3D has a greater temperature difference between the first annular temperature zone 41 and the second annular temperature zone 42 as compared to the structures using the annular boundary members 46b and 46c, and hence the annular boundary member 46d plays a greater role as a heat insulator for heat conduction in the direction in which the first annular temperature zone 41 and the second annular temperature zone 42 are arrayed. Thus, when the annular boundary member 46d is used, the effect of cooling a first heat exchange medium circulated through the first annular medium flow path 43 and a second heat exchange medium circulated through the second annular medium flow path 43 is effectively exerted.

The results in FIG. 4 show that the annular boundary members 46b, 46c, and 46d are suitable as annular boundary members that maintain a temperature difference between the first annular temperature zone 41 and the second annular temperature zone 42.

On the other hand, FIG. 5 is a diagram showing characteristics of the annular boundary members shown by FIGS. 3A to 3D for heat conduction in the vertical direction.

In FIG. 5, the vertical axis represents temperature (K), and the horizontal axis represents distance from a boundary (0) between the first annular temperature zone 41 and the second annular temperature zone 42.

Referring to FIG. 5, as indicated by a broken line, in the structure using the annular boundary member 46a, heat transfer in the vertical direction is smooth, and the surface temperature of the structure main body 45 is uniform at 309 (K). This is because the entire annular boundary member 46a is made of a heat-conducting isotropic material, and heat conductivity is isotropically exerted.

On the other hand, as indicated by a chain line, in the structure using the annular boundary member 46b, a hot spot whose temperature is higher than ambient temperature is formed above the annular boundary member 46b. This is because the heat insulator layer disposed in the partition portion acts as a heat insulator even for heat conduction in the vertical direction, and hence a singular point in terms of temperature is formed above the annular boundary member 46b.

As indicated by a solid line, in the structure using the annular boundary member 46c, there is an area of which temperature is slightly higher than ambient temperature, but it can be said that the temperature of this area is sufficiently lower than the temperature of the corresponding area in the annular boundary member 46b. Thus, in the structure using the annular boundary member 46c, the gradient member constituting the partition portion acts as a heat conductor, not as a heat insulator, for heat conduction in the vertical direction.

On the other hand, as indicated by a two-dot chain line, in the structure using the annular boundary member 46d, no hot spot is formed, but dispersion of heat in the vertical direction is hindered as a whole, and thus the temperature of the entire surface of the structure main body 45 increases as compared to the structures using the other annular boundary members. It is thus clear that the annular boundary member 46d acts as a weak heat insulator for heat conduction in the vertical direction.

Evaluations of the results in FIGS. 4 and 5 are collectively shown in Table 1 below.

Table 1 collectively shows evaluations of the annular boundary members 46a to 46d in FIGS. 3A to 3D with respect to heat insulation in the horizontal radial direction and heat conductivity in the vertical direction. Here, a symbol "o" indicates that the property is excellent, a symbol "Δ" indicates that the property is not excellent but is no good, a symbol "x" indicates that the property is no good. It should be noted that heat insulation in the present embodiment means that heat resists being transferred, but does not mean that heat is not transferred at all.

TABLE 1

|  | Annular boundary member | | | |
| --- | --- | --- | --- | --- |
|  | 46a | 46b | 46c | 46d |
| Heat insulation in horizontal radial direction | x | o | o | o |
| Heat insulation in vertical direction | o | x | o | Δ |

Table 1 shows that the annular boundary member 46c in FIG. 3C using the gradient member as the partition portion is effective as an annular boundary member that acts as a heat insulator for heat conduction in the horizontal radial direction, and acts as a heat conductor for heat conduction in the vertical direction.

Specifically, Table 1 shows that in the zone temperature control structure 40 having the first annular temperature zone 41 and the second annular temperature zone 42, a gradient member of which heat conductivity in the horizontal radial direction is lower than that in the vertical direction, in other words, a gradient member that acts as a heat insulator for heat conduction in the horizontal radial direction and a heat conductor for heat conduction in the vertical direction should be disposed between the first annular temperature zone 41 and the second annular temperature zone 42 in order to prevent a host spot from being formed in response to heat input from above while maintaining a temperature difference between the first annular temperature zone 41 and the second annular temperature zone 42.

Therefore, according to the present invention, the zone temperature control structure having two or more zones of which surface temperatures are controlled to respective different temperatures has a gradient member, of which heat conductivity is lower in the horizontal radial direction than in the vertical direction and which is disposed between the zones.

A description will now be given of a zone temperature control structure according to a first embodiment of the present invention.

Figure 6:
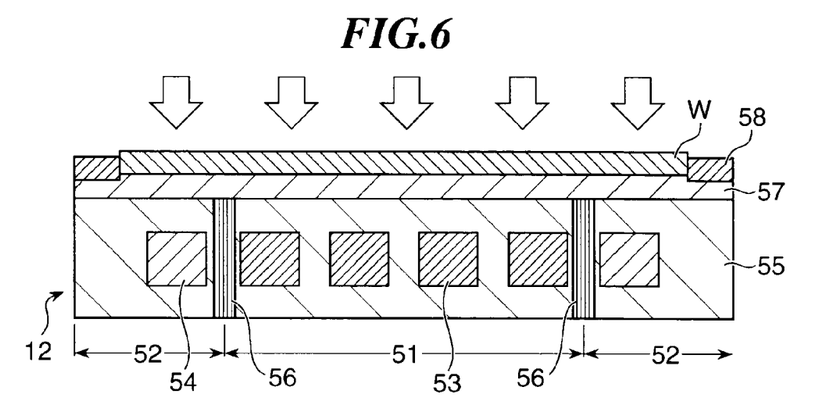
FIG. 6 is a cross-sectional view schematically showing the construction of a susceptor as a zone temperature control structure according to a first embodiment of the present invention.

FIG. 6 is a cross-sectional view schematically showing the construction of a susceptor as a zone temperature control structure according to a first embodiment of the present invention.

Referring to FIG. 6, the susceptor 12 is comprised mainly of a susceptor main body 55 having a center area 51 as a first annular temperature zone and an edge area 52 as a second annular temperature zone, a first annular medium flow path 53 disposed in the center area 51 of the susceptor main body 55 and a second annular medium flow path 54 disposed in the edge area 52 of the susceptor main body 55, and a gradient member 56 made of a heat-conducting anisotropic material disposed between the first annular medium flow path 53 and the second annular medium flow path 54. It should be noted that the susceptor main body 55 is made of a heat-conducting isotropic material, for example, metallic aluminum.

The susceptor 12 is disk-shaped, and has a diameter of, for example, 320 to 400 mm and a thickness of 20 to 50 mm, although it goes without saying that these numeric values vary according to the size of a wafer W mounted on the susceptor 12. A wafer W is mounted on a surface of an upper portion of the susceptor 12 via an electrostatic chuck 57, and a focus ring 58 is disposed so as to surround the wafer W attracted to and held on the electrostatic chuck 57. The center area 51 of the susceptor 12 is cooled by a heat exchange medium at a relatively high temperature flowing through the first annular medium flow path 53, and the edge area 52 of the susceptor 12 is cooled by a heat exchange medium at a relatively low temperature flowing through the second annular medium flow path 54.

The gradient member 56 is disposed between the first annular medium flow path 53 and the second annular medium flow path 54 and at a boundary between the center area 51 and the edge area 52 so as to pass through the susceptor main body 55 in a thickness direction thereof. Thus, the gradient member 56 has an annular shape disposed between the disk-shaped center area 51 and the annular edge area 52.

The temperature of a wafer W mounted on the susceptor 12 is determined by the temperatures of the center area 51 and the edge area 52 on a surface of the susceptor 12, and by extension the temperature of a medium circulated through the first annular medium flow path 52 in the center area 51 and the temperature of a medium circulated through the second annular medium flow path 53 in the edge area 52.

When the susceptor 12 in FIG. 6 is disposed inside the chamber 11 of the substrate processing apparatus 10 in FIG. 1, a heat exchange medium at, for example, 323 (K) is circulated through the first annular medium flow path 53, a heat exchange medium at, for example, 308 (K) is circulated through the second annular medium flow path 54, a processing gas is introduced into the processing chamber 15, plasma-producing radio frequency electrical power is applied into the processing chamber 15 from the second radio frequency power source 20 to excite the processing gas and thereby produce plasma, a surface of the center area 51 of the susceptor 12 reaches, for example, 324 (K), which is slightly higher than 323 (K), and a surface of the edge area 52 of the susceptor 12 reaches, for example, 309 (K), which is slightly higher than 308 (K). At this time, heat input from the processing space S due to the plasma is transmitted uniformly to the entire surface of the susceptor 12, whereby a hot spot is formed on an upper portion of the gradient component 56. Arrows above the wafer W indicate heat input accompanying the generation of the plasma.

According to the present embodiment, heat conduction in a horizontal radial direction of the susceptor 12 having the center area 51 and the edge area 52 adjusted/controlled to different temperatures can be reduced to maintain a temperature difference between these two areas, and smooth heat transfer can be ensured for heat input in a vertical direction to prevent formation of a hot spot and eventually increase heat efficiency.

Moreover, according to the present embodiment, because the gradient member 56 passes through the susceptor main body 55 in the thickness direction thereof, a high heat insulation effect can be obtained for heat conduction in the horizontal radial direction, and this can minimize mutual interference of heat exchange media and prevent energy loss. The susceptor 12 according to the present embodiment is effective at maintaining a temperature difference between the center area 51 and the edge area 52 on the surface of the susceptor 12, and improving heat efficiency of the susceptor 12 as a whole.

In the present embodiment, the thickness of the gradient member 56 in the horizontal radial direction is determined by the degree of heat insulation required between the center area 51 and the edge area 52. Specifically, when high heat insulation is required, the gradient member 56 is thickly formed, and when low heat insulation is enough, the gradient member 56 is thinly formed. When the gradient member 56 is thickly formed, a side face of the gradient member 56 may be in abutment with side faces of the first annular medium flow path 53 and the second annular medium flow path 54. When bringing the gradient member 56 into abutment with both or one of the first annular medium flow path 53 and the second annular medium flow path 54 makes it difficult to maintain physical strength of the susceptor 12 as a whole, it is preferred that both or one of the first annular medium flow path 53 and the second annular medium flow path 54 or the susceptor main body 55 itself is strengthened. It should be noted that the gradient member 56 is preferably made of a material of which thermal expansion coefficient is equal to that of the susceptor main body 55, or a material that can accommodate differences in thermal expansion coefficient between the gradient member 56 and members adjacent thereto.

Although in the present embodiment, the annular temperature zones adjusted/controlled to different temperatures are the two areas consisting of the center area 51 and the edge area 52, the number of different annular temperature zones are not limited to two, but may be three or more.

In the present embodiment, the gradient member 56 acts as a heat insulator for heat conduction in the horizontal radial direction, and acts as a heat conductor for heat conduction in the vertical direction, and is preferably made of a composite material selected from the following: titanium (Ti) and carbon (C), aluminum (Al) and carbon fiber, titanium and aluminum, and glasslike carbon and carbon.

In the present embodiment, the heat conductivity of the gradient member 56 in the horizontal radial direction and the heat conductivity of the gradient member 56 in the vertical direction are determined by their relationship. Specifically, when the gradient member 56 is made of titanium and carbon, the heat conductivity in a low heat conductivity direction and the heat conductivity in a high heat conductivity direction are 10 (W/(m·K)) and 200 (W/(m·K)), respectively, when the gradient member 56 is made of titanium and carbon, the heat conductivity in a low heat conductivity direction and the heat conductivity in a high heat conductivity direction are 150 (W/(m·K)) and 1000 (W/(m·K)), respectively, when the gradient member 56 is made of glasslike carbon and carbon, the heat conductivity in a low heat conductivity direction and the heat conductivity in a high heat conductivity direction are 10 (W/(m·K)) and 200 (W/(m·K)), respectively, and when the gradient member 56 is made of titanium and aluminum, the heat conductivity in a low heat conductivity direction and the heat conductivity in a high heat conductivity direction are 10 (W/(m·K)) and 150 (W/(m·K)), respectively. Thus, materials for the gradient member 56 can be selected so that the ratio of the heat conductivity of the gradient member 56 in the vertical direction to the heat conductivity of the gradient member 56 in the horizontal radial direction can be about 7 or more.

Although in the present embodiment, the temperature adjusting means provided in the center area 51 and the edge area 52 are the medium flow paths through which heat exchange mediums are circulated, the temperature adjusting means in the present embodiment are not limited to being the medium flow paths, but may be thermoelectric elements (for example, Peltier devices) or other heaters, for example, resistance heaters. Adopting medium flow paths, thermoelectric elements, or resistance heaters as the temperature adjusting means facilitates control of the temperature adjusting means, and increases the lifespan of the temperature adjusting means.

A description will now be given of a variation of the first embodiment.

Figure 7:
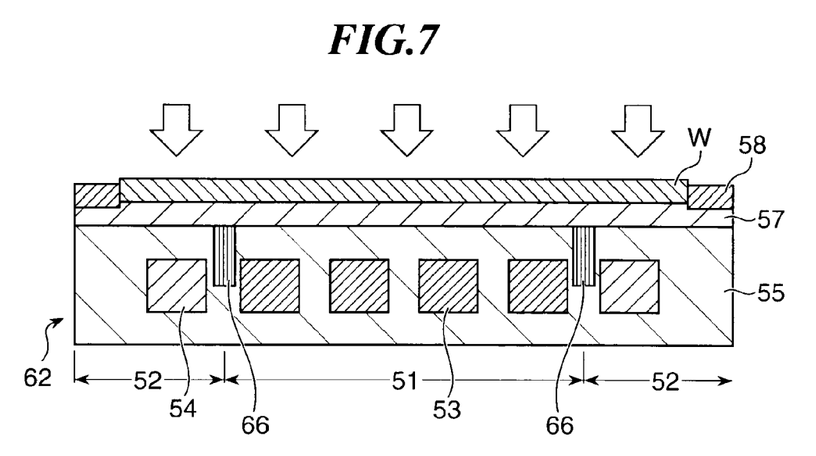
FIG. 7 is a cross-sectional view showing a variation of the susceptor of FIG. 6.

FIG. 7 is a cross-sectional view showing the variation of the susceptor of FIG. 6.

Referring to FIG. 7, a susceptor 62 differs from the susceptor 12 in FIG. 6 in that a gradient member 66 extending from a surface of an upper portion of the susceptor main body 55 to a middle point in a thickness direction thereof is provided in place of the gradient member 56 passing through the susceptor main body 55 in the thickness direction thereof.

According to this variation, as in the susceptor of FIG. 6 described above, heat conduction in the horizontal radial direction at the boundary between the center area 51 and the edge area 52 can be reduced to maintain a temperature difference, and smooth heat transfer can be ensured for heat input from above the susceptor 62 due to plasma to prevent generation of a hot spot above the gradient member 66.

The susceptor 62 according to the present variation is effective at ensuring a temperature difference between the center area 51 and the edge area 52 even if heat efficiency of the susceptor 12 as a whole decreases to some extent.

A description will now be given of a zone temperature control structure according to a second embodiment of the present invention.

Figure 8:
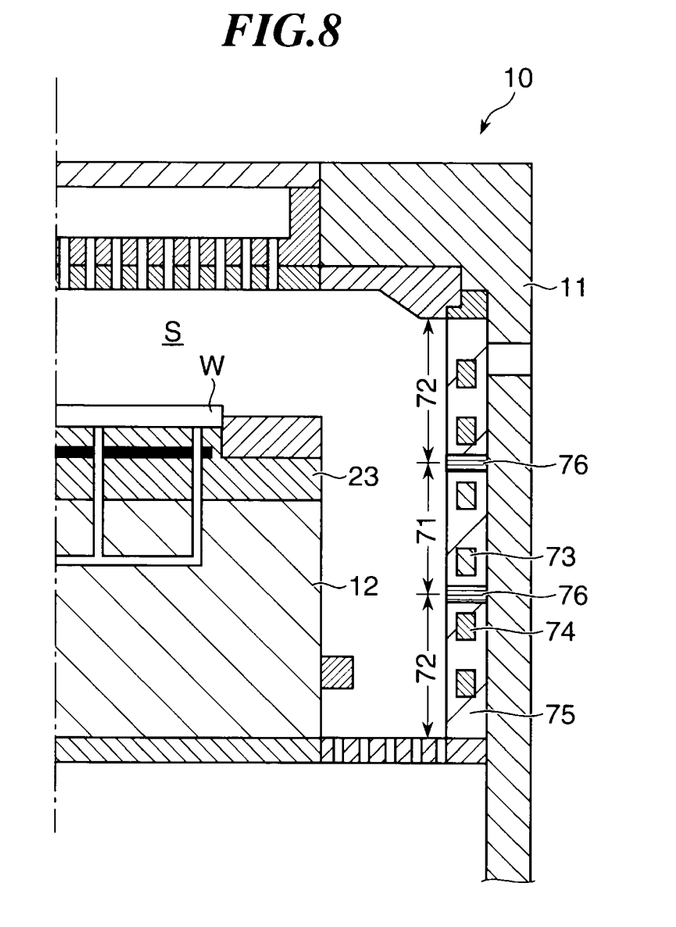
FIG. 8 is a cross-sectional view schematically showing an annular deposit shield as a zone temperature control structure according to a second embodiment of the present invention.

FIG. 8 is a cross-sectional view schematically showing the construction of an annular deposit shield (hereafter referred to as "the annular deposit shield") as the zone temperature control structure according to a second embodiment of the present invention.

The annular deposit shield is provided inside the chamber of the substrate processing apparatus, and attachment of deposit can be prevented by setting the surface temperature of the annular deposit shield at relatively high temperature. Under normal conditions, the surface temperature of the annular deposit shield is set at 400 to 450 (K). However, there may be a case where, to protect a sensor or the like mounted on the deposit shield, deposit is desired to be attached so as to cover only a portion corresponding to a location at which the sensor is mounted. In this case, the annular deposit shield is controlled so that the temperature of the portion corresponding to a location at which the sensor is mounted can be lower than ambient temperature, so that attachment of deposit is promoted. The annular deposit shield used in this way is a zone temperature control structure.

Referring to FIG. 8, the annular deposit shield 75 is provided on a side wall of the chamber 11 of the substrate processing apparatus 10. The annular deposit shield 75 is made of, for example, an aluminum material having isotropic heat conductivity. The annular deposit shield 75 is partitioned into a low-annular temperature zone 71 and a high-annular temperature zone 72. A low-temperature medium flow path 73 is provided in the low-temperature zone 71, and a high-temperature medium flow path 74 is provided in the high-temperature zone 72. A gradient member 76 passing through the annular deposit shield 75 in a thickness direction thereof is provided at a boundary between the low-temperature zone 71 and the high-temperature zone 72.

When a wafer W mounted on a surface of an upper portion of the susceptor 12 via the electrostatic chuck 23 is predetermined plasma processing using the substrate processing apparatus 10 having the annular deposit shield 75 constructed as described above, a heat exchange medium at, for example, 308 (K) is circulated through the low-temperature medium flow path 73 of the annular deposit shield 75, and a heat exchange medium at, for example, 400 (K) is circulated through the high-temperature medium flow path 74 of the annular deposit shield 75, the surface temperature of the low-temperature zone 71 reaches, for example, 310 (K), and the surface temperature of the high-temperature zone 72 reaches, for example, 398 (K), so that a temperature difference therebetween can be excellently maintained. Moreover, at this time, in response to heat input from the processing space S due to plasma, a hot spot is never formed above the gradient component 76.

According to the present embodiment, a temperature difference between the low-temperature zone 71 and the high-temperature zone 72 can be ensured, and heat can be conducted uniformly over the whole area without forming a hot spot in response to heat input from the processing space S due to plasma.

Next, a description will now be given of a zone temperature control structure according to a third embodiment of the present invention.

Figure 9:
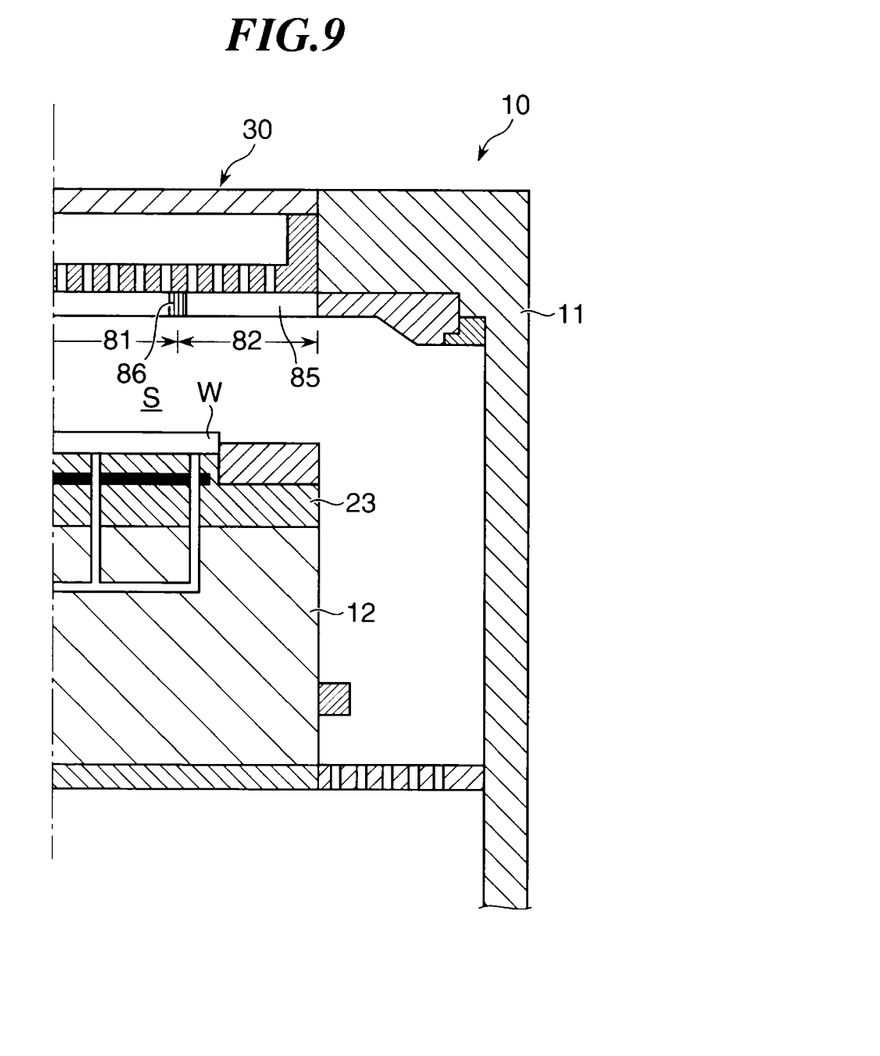
FIG. 9 is a cross-sectional view schematically showing the construction of an upper electrode plate as a zone temperature control structure according to a third embodiment of the present invention.

FIG. 9 is a cross-sectional view schematically showing the construction of an upper electrode plate as the zone temperature control structure according to a third embodiment of the present invention.

The upper electrode plate is a constituent member of the shower head that supplies a processing gas into the processing space, and acts as an electrode when applying radio frequency electrical power to excite the processing gas and produce plasma. The upper electrode plate acts as the zone temperature control structure when providing a temperature difference between the center area and the edge area.

Referring to FIG. 9, the upper electrode plate 85 which is a constituent member of the shower head 30 disposed in the chamber 11 of the substrate processing apparatus 10 is made of a heat-conducting isotropic material, for example, Si and shaped like a disk having a diameter of 300 to 500 mmφ and a thickness of 5 to 10 mm. Across the processing space S, the upper electrode plate 85 faces a wafer W mounted on a surface of an upper portion of the susceptor 12 via the electrostatic chuck 23. The upper electrode plate 85 has an electrode plate center area 81 and an electrode plate edge area 82 opposed to the center area 51 and the edge area 52 of the susceptor 12 shown in FIG. 6. At a boundary between the electrode plate center area 81 and the electrode plate edge area 82, a gradient member 86 is disposed so as to pass through the upper electrode plate 85 in a thickness direction thereof.

As with the center area 51 and the edge area 52 of the susceptor 12 in FIG. 6, the electrode plate center area 81 and the electrode plate edge area 82 of the upper electrode plate 85 constructed as described above are controlled to respective different temperatures and subjected to heat input from below as shown in FIG. 9 accompanying plasma generation in the processing space S. However, because the gradient member 86 is disposed between the electrode plate center area 81 and the electrode plate edge area 82, a lower surface of the upper electrode plate 85 as viewed in FIG. 9 can receive heat input accompanying plasma generation in the processing space S while the electrode plate center area 81 and the electrode plate edge area 82 are held at respective different temperatures, which prevents a hot spot from being formed.

Although the present invention has been described using the embodiments, the present invention is not limited to the above described embodiments.

What is claimed is:

1. A plasma processing apparatus that performs plasma processing on a substrate housed in a chamber, the plasma processing apparatus, comprising:
   a mounting stage disposed in the chamber to mount the substrate thereon;
   an upper electrode plate disposed in the chamber to face the substrate mounted on the mounting stage; and
   a zone temperature control structure applied to at least one of the mounting stage and the upper electrode plate, the zone temperature control structure including:
   at least two zones configured to have surface temperatures thereof controlled to different temperatures, respectively; and
   at least two temperature adjusting means which said at least two zones comprise respectively; and
   a heat-conducting anisotropic material layer disposed between said at least two zones, said heat-conducting anisotropic material configured such that heat conductivity is lower in a direction in which said at least two zones are arrayed than in a direction intersecting the direction in which said at least two zones are arrayed, wherein said heat-conducting anisotropic material layer is T-shaped in cross section, and a vertical portion of the T-shaped cross section partitions said at least two zones, wherein a horizontal portion of the T-shaped cross section is made of a heat-conducting material and both ends of the horizontal portion are disposed so as to lie on upper surfaces of the at least two temperature adjusting means, and wherein plural heat insulator layers with a predetermined width are provided over the vertical portion at predetermined intervals in the direction in which said at least two zones are arrayed.

2. The plasma processing apparatus as claimed in claim 1, wherein in relative relationships with heat conduction in the direction in which said at least two zones are arrayed and heat conduction in the direction intersecting the direction in which said at least two zones are arrayed, said heat-conducting anisotropic material layer acts as a heat insulation layer for heat conduction in the direction in which said at least two zones are arrayed, and acts as a heat conducting layer for heat conduction in the direction intersecting the direction in which said at least two zones are arrayed.

3. The plasma processing apparatus as claimed in claim 1, wherein the ratio of the heat conductivity in the direction intersecting the direction in which said at least two zones are arrayed to the heat conductivity in the direction in which said at least two zones are arrayed is 7 or more.

4. The plasma processing apparatus as claimed in claim 1, wherein said heat-conducting anisotropic material layer is made of a composite material selected from a group of a set of titanium and carbon, a set of aluminum and carbon fiber, a set of titanium and aluminum, and a set of glasslike carbon and carbon.

5. The plasma processing apparatus as claimed in claim 1, wherein said at least two zones are made of heat-conducting isotropic materials.

6. The plasma processing apparatus as claimed in claim 1, wherein the zone temperature control structure is a plate-like unit in which said at least two zones are arrayed in a predetermined direction, and said heat-conducting anisotropic material layer passes the plate-like unit in a thickness direction thereof.

7. The plasma processing apparatus as claimed in claim 1, wherein said heat-conducting anisotropic material layer is disposed between adjacent temperature adjusting means.

8. The plasma processing apparatus as claimed in claim 7, wherein said temperature adjusting means is a medium flow path through which a heat exchange medium is circulated, a Peltier device, or a resistance heater.

9. The plasma processing apparatus as claimed in claim 1, further comprising a deposit shield disposed in the chamber to prevent attachment of deposit generated through the plasma processing, wherein the zone temperature control structure is applied to the deposit shield.

10. A plasma processing apparatus that performs plasma processing on a substrate housed in a chamber, the plasma processing apparatus comprising:

a mounting stage disposed in the chamber to mount the substrate thereon;

an upper electrode plate disposed in the chamber to face the substrate mounted on the mounting stage; and a zone temperature control structure applied to at least one of the mounting stage and the upper electrode plate, the zone temperature control structure including:

at least two zones configured to have surface temperatures thereof controlled to different temperatures, respectively; and at least two temperature adjusting means which said at least two zones comprise respectively; and a heat-conducting anisotropic material layer disposed between said at least two zones, said heat-conducting anisotropic material layer configured such that heat conductivity is lower in a direction in which said at least two zones are arrayed than in a direction intersecting the direction in which said at least two zones are arrayed, wherein said heat-conducting anisotropic material layer is T-shaped in cross section, and a vertical portion of the T-shaped cross section partitions said at least two zones, and wherein a horizontal portion of the T-shaped cross section is made of a heat-conducting material and both ends of the horizontal portion are disposed so as to lie on upper surfaces of the at least two temperature adjusting means, and the vertical portion thereof is made of a heat insulator.

11. The plasma processing apparatus as claimed in claim 10, wherein the heat-conducting material is carbon and the heat insulator is titanium.

12. A plasma processing apparatus that performs plasma processing on a substrate housed in a chamber, the plasma processing apparatus comprising:

a mounting stage disposed in the chamber to mount the substrate thereon;

an upper electrode plate disposed in the chamber to face the substrate mounted on the mounting stage; and a zone temperature control structure applied to at least one of the mounting stage and the upper electrode plate, the zone temperature control structure including at least two zones configured to have surface temperatures thereof controlled to different temperatures, respectively; and at least two temperature adjusting means which said at least two zones comprise respectively; and a heat-conducting anisotropic material layer disposed between said at least two zones, said heat-conducting anisotropic material layer configured such that heat conductivity is lower in a direction in which said at least two zones are arrayed than in a direction intersecting the direction in which said at least two zones are arrayed, wherein said heat-conducting anisotropic material layer is T-shaped in cross section, and both ends of a horizontal portion of the T-shaped section are disposed so as to lie on upper surfaces of the at least two temperature adjusting means, and the vertical portion of the T-shaped cross section partitions said at least two zones, and wherein plural heat insulator layers with a predetermined width are provided at predetermined intervals in a horizontal direction over the entire horizontal portion and the entire vertical portion of the T-shaped cross section.

* * * * *